United States Patent [19]

Najvar

[11] 4,111,770

[45] Sep. 5, 1978

[54] RADIATION CURABLE EPOXY RESIN

[75] Inventor: Daniel J. Najvar, Lake Jackson, Tex.

[73] Assignee: The Dow Chemical Company, Midland, Mich.

[21] Appl. No.: 575,881

[22] Filed: May 9, 1975

[51] Int. Cl.$^2$ .................................................. C08F 8/00
[52] U.S. Cl. .......................... 204/159.15; 204/159.14; 204/159.19; 260/836; 260/837 R; 427/54
[58] Field of Search ....................... 204/159.15, 159.16, 204/159.14; 260/836, 837 R

[56] References Cited

U.S. PATENT DOCUMENTS

| | | | |
|---|---|---|---|
| 3,367,992 | 2/1968 | Bearden | 260/837 |
| 3,683,045 | 8/1972 | Baldwin | 260/837 R |
| 3,808,114 | 4/1974 | Tsuchihara et al. | 204/159.16 |
| 3,843,612 | 10/1974 | Vogel et al. | 260/63 UY X |
| 3,892,819 | 7/1975 | Najvar | 260/836 |
| 3,905,931 | 9/1975 | Ziegert | 260/29.6 NR |
| 3,912,773 | 10/1975 | Havriliak | 260/42.28 |
| 3,928,491 | 12/1975 | Waters | 260/837 |
| 3,932,556 | 1/1976 | Takamori et al. | 260/836 |
| 3,968,181 | 7/1976 | Uzelmeier et al. | 260/837 |

*Primary Examiner*—Richard B. Turer

[57] ABSTRACT

A carboxyl containing polymer is either prepared in the presence of a polyepoxide or reacted with a polyepoxide. The polymer has sufficient acid groups to react with only about 1 to 10 percent of the epoxide (oxirane) groups. The remaining epoxide groups are reacted with an unsaturated monocarboxylic acid such as acrylic or methacrylic acid to form a radiation curable resin.

10 Claims, No Drawings

RADIATION CURABLE EPOXY RESIN

BACKGROUND

Valuable resins are known which can be prepared by basically reacting an unsaturated acid such as acrylic acid with each of the epoxide groups of a polyepoxide. In many instances it is desirable to dissolve this resin in a copolymerizable monomer such as styrene for making reinforced plastics or various acrylate esters when formulating radiation polymerizable compositions. From a practical standpoint the choice of monomers is sometimes limited because certain monomers may be too volatile or too toxic, have an undesirable odor, etc. to be useful under the conditions employed. For example, inks which are curable by ultraviolet light may be unable to use toxic or highly volatile momomers because of the hazards they would produce to people who would be using the inks. However, certain of these monomers may be very desirable from the standpoint of the properties they would add to the cured product. This invention makes it possible to obtain at least partial benefit from such monomers by modifying the above resin under controlled production conditions where the hazards involved can be safely handled.

For other reasons, part of the acrylic acid and like reactant has been replaced in one instance by an acid terminated unsaturated polyester as disclosed in U.S. Pat. No. 3,506,736 or in a second instance by a carboxyl terminated rubber as disclosed in Ser. No. 343,716, filed on Mar. 21, 1973 by D. J. Najvar, now U.S. Pat. No. 3,892,819. However, this invention concerns another method of modifying the resins for a different purpose and with beneficial results.

SUMMARY OF THE INVENTION

Without facing the problems of volatility, toxicity, odor, flammability, pollution etc. which may be present from certain monomers, new resins can be prepared which incorporate such monomers in pre-polymerized form as part of the resin itself. By this invention the valuable properties which may be derived from these monomers can be utilized in the resins of this invention to obtain better weatherability or toughness, reduce costs and the like.

The benefits of this invention are obtained by pre-polymerizing one or more of these problem monomers with a vinyl acid and, optionally, with any other type of copolymerizable monomer to obtain the desired property improvement and by incorporating this pre-polymer into the resin by chemical reaction of the acid groups with the epoxide (oxirane) groups of a polyepoxide. The pre-polymer is designed to have a sufficient amount of a vinyl acid to provide enough acid groups to react with about 1 to 10 percent of the epoxide groups. The remaining epoxide groups are reacted with an unsaturated monocarboxylic acid to introduce polymerizable unsaturated ester groups.

The pre-polymer may be polymerized and then reacted with the polyepoxide and unsaturated acid or the pre-polymer may be polymerized in the presence of the polyepoxide. In any event, the monomer mixtures employed to prepare the pre-polymer should contain 2 to 20, preferably about 3 to 10, weight percent of a vinyl acid and the balance to make 100 percent of one or more copolymerizable monomers. The choice of copolymerizable monomer depends on the property improvement desired. While problem monomers may be utilized in the above manner the invention is not limited to these monomers.

DESCRIPTION

The pre-polymer may be prepared prior to reaction with the polyepoxide or in its presence. In fact liquid polyepoxides serve both as a solvent and as a reactant. In order to minimize cross-linking or gelation the pre-polymer is prepared from a monomer mixture containing about 2 to 20, and preferably about 3 to 10, weight percent of a vinyl acid monomer. The balance to make 100 percent may be one or more copolymerizable monomers which have been selected for the properties it is desired to impart to the resin.

An excess of a polyepoxide is employed such that the acid groups of the pre-polymer provide only about 1 to about 10 percent of the acid groups for reaction with the epoxide groups. The remaining epoxide (oxirane) groups are reacted (capped) with an unsaturated monocarboxylic acid to form the terminal vinyl reactive sites in the final resin.

To illustrate the resins of this invention the following non-limiting examples are presented.

EXAMPLE I

A diglycidyl ether of bisphenol A having an epoxide equivalent weight (EEW) of 188 (484 grams) was placed in a 2-liter Pyrex resin kettle fitted with means for agitation, temperature control, addition of reactants, etc.

A monomer mixture was prepared from 104 grams of styrene, 128 grams of n-butyl acrylate, 9.3 grams of acrylic acid and 2.4 grams of benzoyl peroxide. Seventy-five mls of this monomer mixture was added to the glass kettle and the contents were mixed and heated to 110° C. The remaining monomer mixture was added over a one hour period controlling the exotherm temperature at 110° C. The contents were then heated to 130° C for 2 hours. Infrared analysis indicated polymerization was complete by the disappearance of vinyl groups. The pre-polymer had a molecular weight of about 25,000 by GPC analysis. The contents were heated to 180° C and then cooled to 100° C.

To the kettle contents was then added 0.32 gram of hydroquinone, 176 grams of acrylic acid and 1 ml of a tertiary amine catalyst, tris-dimethylaminomethyl phenol. Reaction was allowed to continue until the acid content was about 1% (as —COOH). The resin was then blended with 45% 2-hydroxypropyl acrylate and stored for future use.

The stored resin was clear with no gels evident and had a viscosity of 2270 cps at 75° F. A ⅛ inch thick clear casting was prepared by adding 0.5% of a peroxide catalyst (USP 245) and curing for 6 hours at 80° C and 1 hour at 250° F. The tensile strength was 5073 psi, elongation was 27% and Shore D hardness was 85.

A portion of the stored resin was coated on a Bonderite 37 steel panel and cured in a nitrogen atmosphere with 6 megarads of ionizing radiation using a 1 mev accelerator. The panel passed 140 inches reverse Gardner impact, could not be scratched with the fingernail and had 100% adhesion by the cross-hatched-tape method. The cured coating was tack free to the touch.

EXAMPLE 2

Similar to Example 1 a monomer mixture of 80 grams of styrene, 150 grams of n-butyl acrylate, 10 grams of acrylic acid and 3.2 grams of benzoyl peroxide was added over a 1.5 hour period to 484 grams of a similar polyepoxide heated at 90°–100° C. The reaction product was heated to 160° C to deactivate the catalyst and cooled to 100° C as before. The EEW of the reaction product at this stage was 362.

Then, 0.26 gram of hydroquinone, 145 grams of acrylic acid and 0.9 gram of catalyst were added and the mixture heated to 110° C and then to 118° C until the acid content reached 0.63% by weight.

A portion of the resin was mixed with 45% by weight 2-hydroxypropyl acrylate and cooled. Its viscosity was 2153 cks. A clear casting was prepared as before and its properties were: elongation of 63%, tensile of 3663 psi and a hardness of 75.

A 2 mil coating was prepared and cured with 2 megarads of radiation as before. The coated panel passed 120 inches of reverse impact and had good solvent resistance to acetone, xylene and methanol. The surface was smooth, glossy, could not be scratched with the fingernail and had 100% adhesion.

The capabilities in this invention of varying properties such as elongation while maintaining other desirable properties such as hardness and adhesion is evident from the above.

EXAMPLE 3

The acid concentration in a pre-polymer prepared according to Example 1 was increased by adding to 500 grams of the polyepoxide a monomer mixture containing 208 grams of styrene, 256 grams of n-butyl acrylate, 30 grams of acrylic acid and 9 grams of catalyst and polymerizing the monomers. The EEW of the reaction product was 368. To this was then added and reacted 170 grams of acrylic acid along with 0.35 gram of hydroquinone and 1.5 grams of catalyst. The resin was diluted with 40% of the same monomer.

A clear casting had an elongation of 60% and a tensile of 4800 psi. A panel coating cured with 6 megarads of radiation produced a glossy, non-tacky coating with a hardness of 5–6, reverse impact of 120–140 inches and 100% adhesion.

EXAMPLE 4

An all acrylate pre-polymer was prepared in 600 grams of the polyepoxide by polymerizing 100 grams of methyl methacrylate, 128 grams of n-butyl acrylate, 17 grams of acrylic acid with 5 grams of benzoyl peroxide. Then 204 grams of acrylic acid was added and reacted as before. The resin was then diluted with ethyl hexyl acrylate (EHA) and the viscosity measured.

| Sample | Wt. % EHA | Wt. % HPA* | Visc., cps |
|---|---|---|---|
| 1 | 50 | — | 720 |
| 2 | 45 | — | 1800 |
| 3 | 40 | — | 3400 |
| 4 | 25 | — | 26,400 |
| 5 | 18 | 26 | 2840 |

*hydroxypropyl acrylate

Except for sample 4 clear panel coatings were prepared and cured with 2 megarads of radiation.

| Sample | Impact Reverse | Front |
|---|---|---|
| 1 | 75" | 50" |
| 2 | 75 | 100 |
| 3 | 75 | 50 |
| 5 | 75 | 100 |

All the coatings were smooth, glossy and tack free.

The following additional resins were prepared in a manner similar to the previous examples. Acrylic acid was used to cap unreacted epoxide groups following preparation of the pre-polymer.

EXAMPLE 5

Polyepoxide: bisphenol A diglycidyl ether (EEW 190)
Pre-Polymer Monomers: Acrylic acid (AA), styrene (STY) and n-butylacrylate (BA)
AA/Epoxide: 0.05/1
Mole Ratio STY/BA: 1/1
% Pre-Polymer: 50%
% Benzoyl Peroxide (BPO): 0.1%

When the AA/Epoxide ratio was 0.158 (i.e. sufficient AA to react with 15.8% of the epoxide groups), the reaction mixture gelled during copolymerization of the pre-polymer. It was found this ratio should be at most about 0.10 to prevent gelation during copolymerization. Following preparation of the pre-polymer the remaining epoxide groups were capped with acrylic acid.

EXAMPLE 6

Polyepoxide: bisphenol A diglycidyl ether (EEW 190)
Pre-Polymer Monomers: AA, STY, BA and methyl methacrylate (MMA)
AA/Epoxide: 0.05/1
Mole Ratio STY/BA/MMA: 1/1/1
% Pre-Polymer: 40%
% BPO: 1%

EXAMPLE 7

Polyepoxide: polypropylene glycol diepoxide (EEW 176)
Pre-Polymer Monomers: AA, STY and BA
AA/Epoxide: 0.068/1
Mole Ratio STY/BA: 1/1
% Pre-Polymer: 41%
% BPO: 1%

EXAMPLE 8

Polyepoxide: polypropylene glycol diepoxide (EEW 176)
Pre-Polymer Monomers: AA, STY, BA and MMA
AA/Epoxide: 0.05/1
Mole Ratio STY/BA/MMA: 1/1/1
% Pre-Polymer: 40%
% BPO: 1%

EXAMPLE 9

Polyepoxide: polypropylene glycol diepoxide (EEW 176)
Pre-Polymer Monomers: AA, STY, BA and 2-ethylhexyl acrylate (EHA)
AA/Epoxide: 0.05
Mole Ratio STY/BA/EHA: 1/1/1
% Pre-Polymer: 40%
% BPO: 1%

With this polyepoxide, as before, when the AA/epoxide ratio was 0.148/1 gelation occurred during polymerization of the pre-polymer.

EXAMPLE 10

Polyepoxide: polypropylene glycol diepoxide (EEW 323)
Pre-Polymer Monomers: AA, STY and BA
AA/Epoxide: 0.09/1
Mole Ratio STY/ BA: 1/1
% Pre-Polymer: 44%
% BPO: 1%

EXAMPLE 11

Polyepoxide: diglycidyl ether of neopentyl glycol (EEW 136)
Pre-Polymer monomers: AA, STY and BA
AA/Epoxide: 0.038/1
Mole Ratio STY/BA: 1/1
% Pre-Polymer: 41%
% BPO: 1%

As indicated, the remaining epoxide groups in each of the above resins was capped with acrylic acid. Methacrylic acid may be used in place of acrylic acid with similar results.

Benzoyl peroxide was employed as the pre-polymer polymerization catalyst. It was found that a 1% catalyst level was satisfactory, but if the level was increased too high gelation of the resin occurred. Gelation also occurred if the equivalents of acrylic acid used in making the pre-polymer exceeded about 10% of the equivalents of epoxide. Diethylaminoethyl acrylate used in small proportions as an adhesion promoter in the pre-polymer failed to react with the comonomers. It also caused gelation during preparation of the resin because a tertiary amine is a catalyst. However, the monomer can be used as a diluent for the completed resin in addition to other acrylic monomers and it does improve adhesion in radiation cured thin films. Gelation in other resin preparations occurred randomly but this was mainly due to impurities or contaminants or to experimental error.

EXAMPLE 12

Both clear and pigmented film properties of the resins of Examples 5–11 were determined. The clear films at 25% monomer were drawn down using a Meyer wire wound rod on Bonderite 37 steel panels and cured with an electron beam. Other resins were adjusted to 500 cs viscosity, pigmented to 40% TiO$_2$ and ball milled overnight. Coatings were prepared as above and cured with an electron beam. Other films were drawn down on fabric and observed for "hand" qualities, i.e., feel and softness.

such as the bisphenol A based polyepoxides, epoxy novolacs and polyglycidyl ethers of polyhydric alcohols such as neopentyl glycol, glycerol, polypropylene glycols and the like. Generally the EEW will range from about 150 up to 1500, although this range should not be considered limiting.

In addition to capping the resin with acrylic acid other unsaturated monocarboxylic acids may be used including methacrylic acid, cinnamic acid, crotonic acid and hydroxyalkyl acrylate or methacrylate half esters of dicarboxylic acids which may be either saturated or unsaturated. The latter are conveniently made by reacting the diacid anhydride, e.g. maleic anhydride, with a hydroxyalkyl acrylate or methacrylate in equal molar amounts.

The vinyl acid used to prepare the pre-polymer may, of course, be acrylic acid, methacrylic acid and the like but also may be selected from a variety of polybasic acids many of which are readily available. Additional vinyl acids include itaconic acid, fumaric acid, maleic acid, half esters of the dibasic acids, half amides of the dibasic acids and the like. Importantly, the vinyl acid is used to provide the acid group for reaction with the epoxide group to incorporate the pre-polymer by chemical reaction as part of the finished resin.

In making the pre-polymer a variety of monomers copolymerizable with the vinyl acid may be used. As shown, styrene, methyl methacrylate and n-butylacrylate may be used. Other monoalkenyl aromatic monomers such as vinyl toluene, halogen substituted monomers such as chlorostyrene, alkyl substituted monomers such as t-butyl styrene and the like may be used. Any of the esters of acrylic and methacrylic acid, especially those commercially available may be used. The esters include the methyl, ethyl, propyl, cyclohexyl, 2-ethyl hexyl and like esters as well as the hydroxyalkyl esters. Even though the latter contain a hydroxyl group the amount of reaction with the epoxide groups is insignificant under the conditions employed. Other useful monomers would include the vinyl esters such as vinyl acetate, acrylonitrile, vinyl ethers and the like. A number of the above named monomers present hazards due to odor, volatility, toxicity, etc. which are negated by first incorporating them in the form of a pre-polymer under controlled production conditions.

The pre-polymer may be prepared employing standard polymerization methods, conditions, catalysts, etc. This is well known and does not need repeating here. Standard polymerization inhibitors may also be used during preparation of the pre-polymer and/or during

|  | Ex. 5 | Ex. 6 | Ex. 7 | Ex. 8 | Ex. 9 | Ex. 10 | Ex. 11 |
|---|---|---|---|---|---|---|---|
| Avg. Mol. Wt. of Copolymer | 118,000 | 107,000 | 40,000 | 35,000 | 40,000 | 40,000 | 46,000 |
| Visc. at 25° C, 25% Monomer, cs | 450,000 | 400,000 | 10,100 | 5,400 | 3,200 | 5,300 | 7,800 |
| Monomer | APA[1] | APA | HPA[2] | APA | APA | HPA | HPA |
| Clear Films | | | | | | | |
| Pencil Hardness | 5H | 3H | 2H | 4H | 4H | 2H | 3H |
| 2 hr. water boil | S.Y.[3] | S.Y. | S.Y. | O.K. | O.K. | S.Y. | S.Y. |
| Adhesion (% Retained) | 100 | 100 | 90 | 50 | 100 | 100 | 100 |
| Reverse Impact (in-lbs) | 140 | 120 | 100 | 100 | — | 140 | 100 |
| Pigmented Films | | | | | | | |
| Monomer concn. at 500 cs, % | 65 | 61 | 51 | 45 | 44 | 47 | 47 |
| Pigment Wettability | poor | poor | fair | good | good | good | good |
| Fabric "Hand" | fair | poor | v. good | good | good | v. good | good |

[1]APA - acetoxypropyl acrylate
[2]HPA - hydroxypropyl acrylate
[3]S.Y. - slight yellow In place of the polyepoxide employed in the above examples one may use any of a variety of polyepoxides including polyglycidyl ethers of polyhydric phenols the final vinyl acid capping process. Catalysts for the acid/epoxide reaction are also well known and include tertiary amines, triphenyl stibine and arsine, phosphonium compounds, various metal compounds, etc. Monomers with catalytic groups should not be employed in making the pre-polymer. Generally, the weight of the copolymer will range from about 1 to 60 weight percent of the combined weight of pre-polymer and polyepoxide.

After preparation of the resin it is usually beneficial to combine it with a copolymerizable monomer as in the examples. However, the resin, per se, can be readily cured without such monomers and in many areas of use it is preferred to use only the resin. Any of the previously mentioned monomers may be used. Styrene is a widely used monomer, especially for reinforced plastics. The acrylates are also widely used especially for curing by radiation and more especially by ultraviolet light. Additional monomers especially preferred in the latter instance are the acrylate polyesters of polyhydric alcohols such as the di-, tri- and tetra-acrylates of pentaerythritol. These monomers may be used in any compatible amount.

The resins or resin-monomer mixture may be cured in any conventional manner such as heating it in the presence of a free radical yielding catalyst, exposing it to ionizing radiation or exposing it to ultraviolet light usually in the presence of a photoinitiator.

It is also known to further modify resins similar to this by reaction of the hydroxyl group (produced from the acid/epoxide reaction) with an anhydride, an isocyanate or other like hydroxyl reacting compounds. Such modification may be employed herein.

The resins may be combined with inert fillers, pigments or colorants, mold release agents, low profile polymeric additives, impact modifiers and the like.

What is claimed is:

1. A radiation curable resin prepared by (a) polymerizing to substantial completion a mixture of vinyl monomers, in the presence of a polyepoxide having more than one 1,2-oxirane groups per molecule, wherein the mixture comprises about 2 to 20 weight percent of a vinyl acid and the balance to make 100 percent of one or more copolymerizable monovinyl monomers, (b) deactivating any residual addition polymerization catalyst and (c) reacting with the product of step (a) an unsaturated monocarboxylic acid; wherein the total acid equivalents per oxirane equivalent vary from about 0.8 to 1.2 and wherein the vinyl acid of step (a) comprises about 1 to 10 percent of the total acid equivalents.

2. The composition of claim 1 wherein the unsaturated monocarboxylic acid is acrylic or methacrylic acid.

3. The composition of claim 1 wherein the copolymerization monovinyl monomer comprises one or more monomers selected from the group consisting of monoalkenyl aromatic monomers and esters of acrylic and methacrylic acid.

4. The composition of claim 3 wherein said aromatic monomer is styrene.

5. The composition of claim 1 wherein the proportion of vinyl acid varies from about 3 to 10 percent.

6. The composition of claim 1 wherein the polyepoxide is a polyglycidyl ether of a polyhydric phenol, an epoxy novolac or mixtures thereof.

7. The composition of claim 1 further comprising of a photoinitiator.

8. The composition of claim 1 dissolved in a copolymerizable monomer.

9. The composition of claim 1 wherein in step (a) the weight percent of vinyl monomers comprises about 1 to 60 weight percent of the combined weight of monomers and polyepoxide.

10. A process for producing a radiation curable resin which comprises (a) polymerizing to substantial completion, in the presence of a polyepoxide having more than one 1,2-oxirane group per molecule, a mixture comprising 2 to 20 weight percent of a vinyl acid and the balance to make 100 percent of one or more copolymerizable monovinyl monomers, (b) deactivating any addition polymerization catalyst and (c) reacting the product of step (a) with an unsaturated monocarboxylic acid; wherein the total acid equivalents per oxirane equivalent is from 0.8 to 1.2 and wherein the vinyl acid of step (a) is from 1 to 10 percent of the total acid equivalents.

* * * * *